United States Patent [19]
Niklos

[11] Patent Number: 5,921,817
[45] Date of Patent: *Jul. 13, 1999

[54] MULTIPIN PLUG CONNECTOR ADAPTER

[75] Inventor: John R. Niklos, Worthington, Ohio

[73] Assignee: CompuServe Incorporated, Columbus, Ohio

[*] Notice: This patent issued on a continued prosecution application filed under 37 CFR 1.53(d), and is subject to the twenty year patent term provisions of 35 U.S.C. 154(a)(2).

[21] Appl. No.: 08/820,450

[22] Filed: Mar. 17, 1997

Related U.S. Application Data

[63] Continuation of application No. 08/366,311, Dec. 29, 1994, abandoned.

[51] Int. Cl.⁶ ............................. H01R 9/09; H01R 31/06
[52] U.S. Cl. ........................................ 439/638; 439/540.1
[58] Field of Search ................................ 439/76.1, 540.1, 439/79, 547, 550, 564, 573, 638, 639

[56] References Cited

U.S. PATENT DOCUMENTS

| | | |
|---|---|---|
| 3,406,368 | 10/1968 | Curran ........................................ 439/79 |
| 3,551,874 | 12/1970 | Volinskie ................................ 439/76.1 |
| 3,729,698 | 4/1973 | Chapman .............................. 439/540.1 |
| 3,950,058 | 4/1976 | Cronin ................................... 439/540.1 |
| 4,131,330 | 12/1978 | Stupay .................................... 439/540.1 |
| 4,353,614 | 10/1982 | Etchison, Jr. et al. ................ 439/540.1 |
| 4,758,167 | 7/1988 | Bepoix ..................................... 439/76.1 |
| 5,227,955 | 7/1993 | Le Bris et al. ......................... 439/76.1 |
| 5,249,981 | 10/1993 | Abell et al. .............................. 439/550 |
| 5,411,416 | 5/1995 | Balon et al. ............................. 439/639 |
| 5,426,567 | 6/1995 | Opeka ..................................... 439/573 |
| 5,459,637 | 10/1995 | Ma et al. ................................. 439/638 |

FOREIGN PATENT DOCUMENTS 2037506  7/1980  United Kingdom ................... 439/540

*Primary Examiner*—Neil Abrams
*Attorney, Agent, or Firm*—Standley & Gilcrest

[57] ABSTRACT

The present invention in broadest terms includes an adapter for a plurality of multipin connectors, said adapter comprising: (a) a circuit board having a connector-mounting side; (b) a plurality of multipin connectors, each of said multipin connectors disposed on said connector-mounting side of said circuit board so as to be in electrical contact therewith; and (c) a plural electrical wire conduit in electrical contact via a plug with said circuit board so as to be in electrical contact with each of said multipin connectors.

11 Claims, 6 Drawing Sheets

5,921,817

MULTIPIN PLUG CONNECTOR ADAPTER

This application is a file wrapper continuation of application Ser. No. 08/366,311 filed Dec. 29, 1994, now abandoned.

TECHNICAL FIELD

The present invention pertains to the field of electrical connectors.

BACKGROUND

In the use of computers, modems and other types of electrical devices, it is often necessary to attach several electrical connectors to such devices.

There are many disadvantages to the use of a number of individual wires each with its own individual connector. One of the difficulties is that a number of converging wires is that individual wires are difficult to locate and handle. Converging wires make it difficult to identify and grasp any given connector and remove and/or reattach it from its respective outlet.

Also, converging wires can become tangled and can occupy a great deal of space, normally by extending a substantial distance from the electrical device(s) to which they are attached. By occupying a large volume of space beside the electrical device(s), additional room is needed for storage, such as in cabinets, etc.

Yet another problem associated with a mass of converging wires is that ventilation around the electrical device(s) may be compromised.

It is therefore an object of the present invention to provide a connector adapter that can be conveniently installed and used in a variety array of electronic components to allow the efficient connection and disconnection thereof. An object of the present invention is to provide a connector that is easy to see and which can be removed without spatial interference. Another object of the invention is to produce a connector adapter that provides easy registration and connection of a plurality of connectors.

It is also an object of the present invention to provide a connector adapter that diminishes the possibility of tangling of associated wiring.

Finally, it is and object of the present invention to provide a connector adapter that better allows for the free movement of air about the associated electrical device.

In view of the present disclosure and/or through practice of the present invention, other advantages, and the solutions to other problems, may become apparent.

SUMMARY OF THE INVENTION

The present invention in broadest terms includes an adapter for a plurality of multipin connectors, said adapter comprising: (a) a circuit board having a connector-mounting side; (b) a plurality of multipin connectors, each of said multipin connectors disposed on said connector-mounting side of said circuit board so as to be in electrical contact therewith; and (c) a plural electrical wire conduit in electrical contact with said circuit board so as to be in electrical contact with each of said multipin connectors.

The connectors used in accordance with the present invention may be of any type which can be mounted on a circuit board. Such connectors include multipin connectors, such as nine-pin and twenty-five-pin connectors.

The circuit boards used in accordance with the present invention also may be of any type to which multi pin connectors may be mounted. Preferably, the multipin connectors may be directly soldered to the circuit board by known techniques. Naturally, the arrangement of the connectors on the circuit board may be in any series or geometry according to that of the connectors correspondingly arranged on the electrical device.

The present invention also includes an electrical device having a plurality of multipin connectors, and an adapter for a plurality of multipin connectors as described above. The electrical device has a plurality of first multipin connectors; and the adapter comprises a circuit board having a connector-mounting side with a plurality of second multipin connectors, the second multipin connectors adapted to engage said first multipin connectors. A plural electrical wire conduit, in electrical contact with the circuit board so as to be in electrical contact with each of the second multipin connectors, is also included.

The electronic devices used in accordance with the present invention may be of any type. Such devices may include computers, amplifiers, modems, receivers, transceivers, tuners, etc.

DETAILED DESCRIPTION OF THE PREFERRED EMBODIMENT

In accordance with the foregoing summary of the invention, the following presents a description of two examples of the present invention, considered to be the best mode of the invention.

Figure 1:
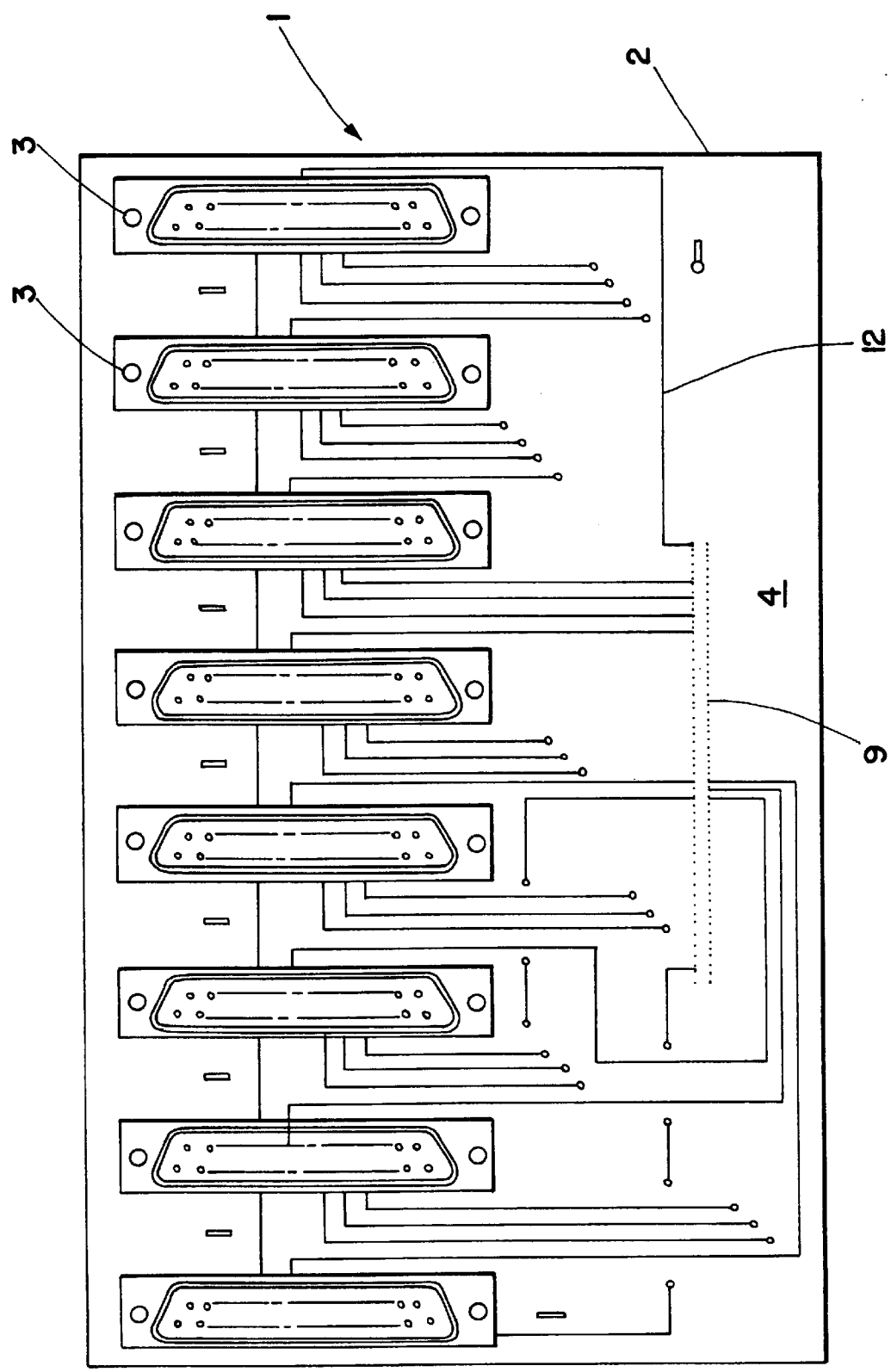
FIG. 1 is a plan view of the top, connector-attachment side of a multi-pin connector adapter in accordance with one embodiment of the present invention.

FIG. 1 shows a multi-pin connector adapter 1 comprising circuit board 2 having a number of multi-pin plugs 3 attached to its connect-attachment side surface 4.

Figure 2:
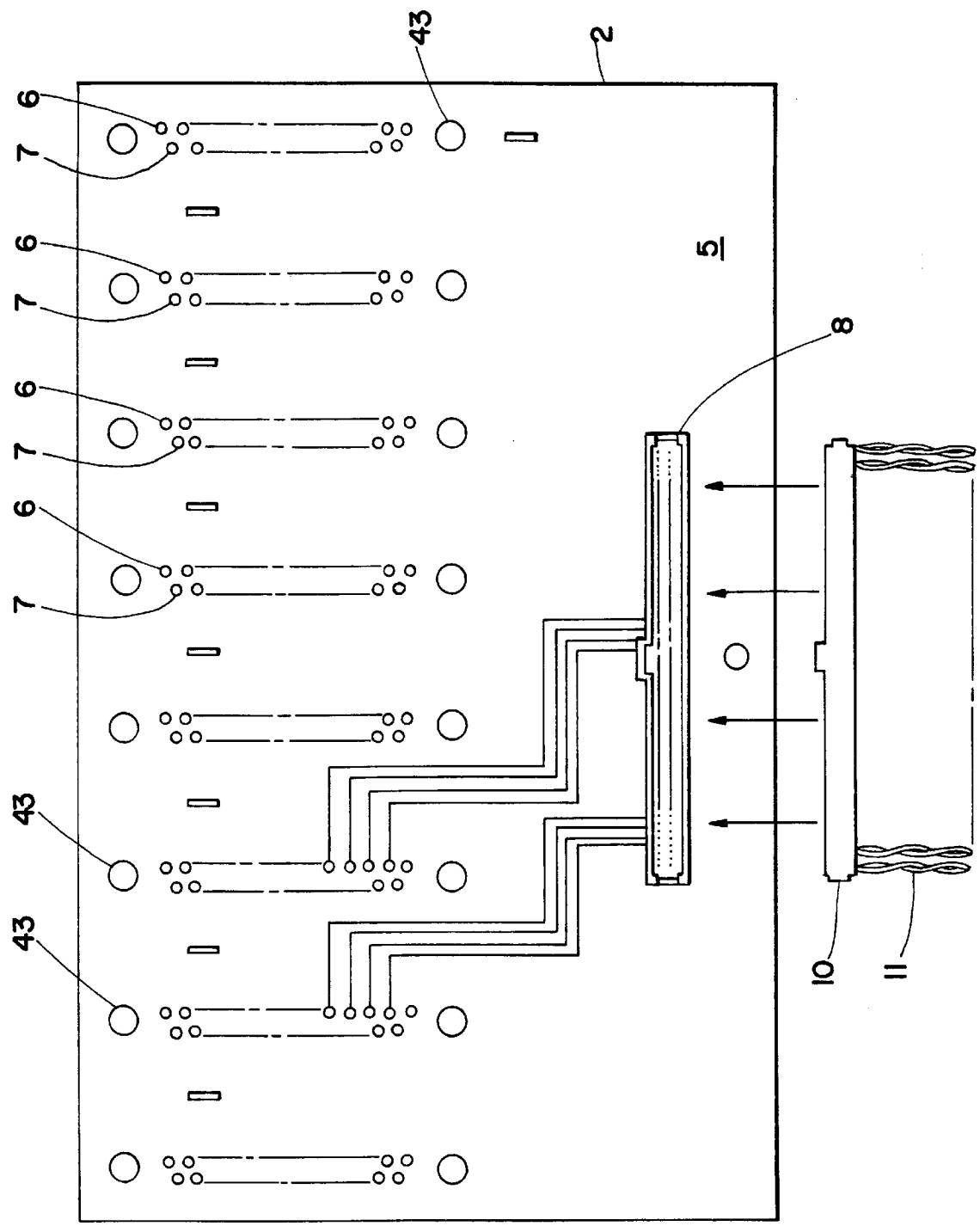
FIG. 2 is a plan view of the underside side of a multi-pin connector adapter in accordance with one embodiment of the present invention.

FIG. 2 shows the underside surface 5 of circuit board 2. FIG. 2 also shows the solder points 6 corresponding to the attachment points 7 of the multi-pin plugs 3, which are attached by the pin attachments of the multi-pin plugs passing through the circuit board to the underside where they are attached by soldering. FIG. 2 also shows holes 43 which allow the set screws of each of the multi-pin plugs to be attached to the corresponding connectors on the electronic device.

FIG. 2 also shows wire connector 8 which is attached to underside surface 5. Wire connector 8 in turn connects to ribbon wire plug 10 of plural electrical wire conduit or ribbon wire 11. FIG. 1 also shows the solder points corresponding to the attachment points 9 of the wire connector 8, which is attached by the pin attachments of the wire connector passing through the circuit board to the underside where they are attached by soldering. FIG. 1 also shows circuit board traces which allow multi-pin plugs 3 to be in electrical contact with ribbon wire 11 via ribbon wire plug 10.

Figure 3:
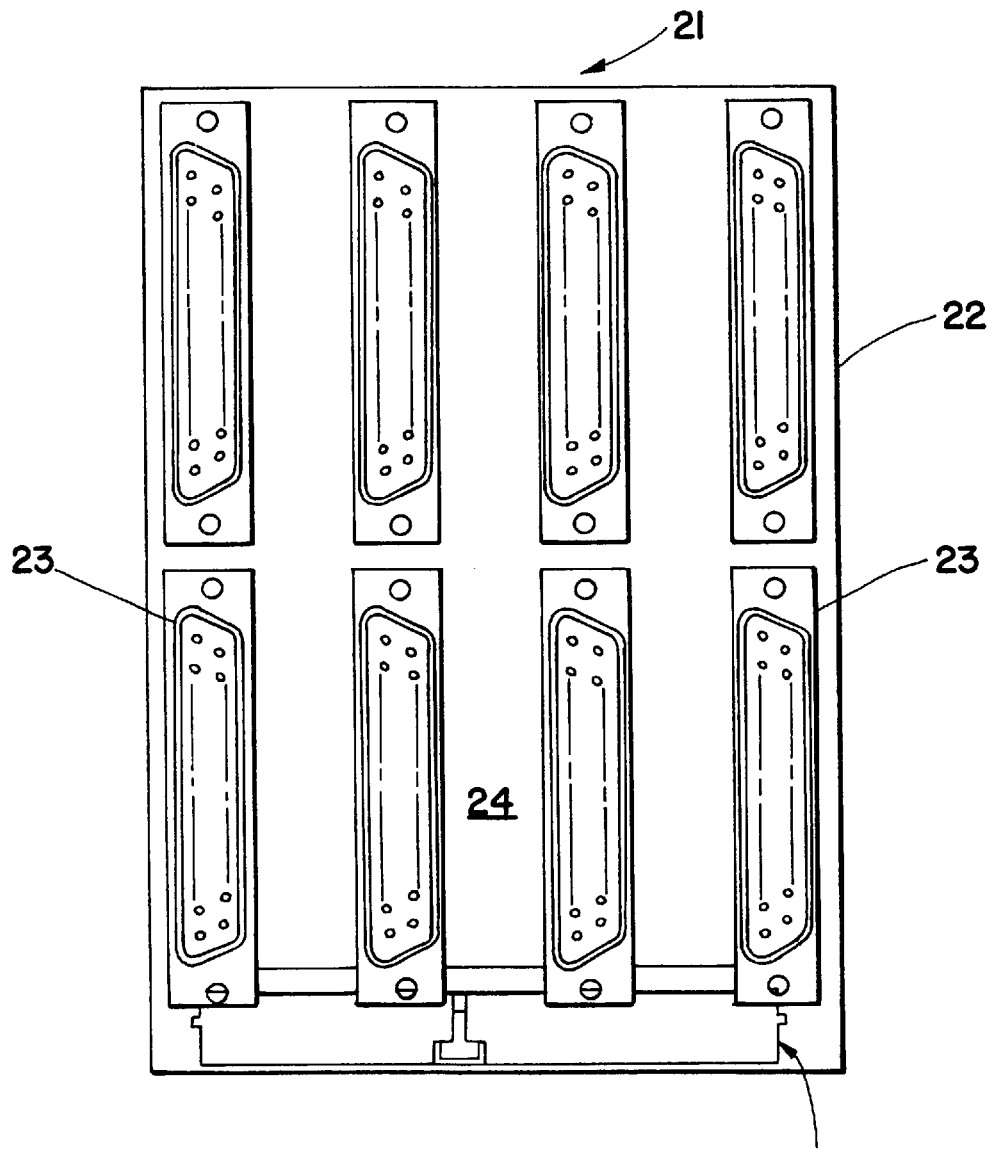
FIG. 3 is a plan view of the top, connect-attachment side of a multi-pin connector adapter in accordance with another embodiment of the present invention.
Figure 4:
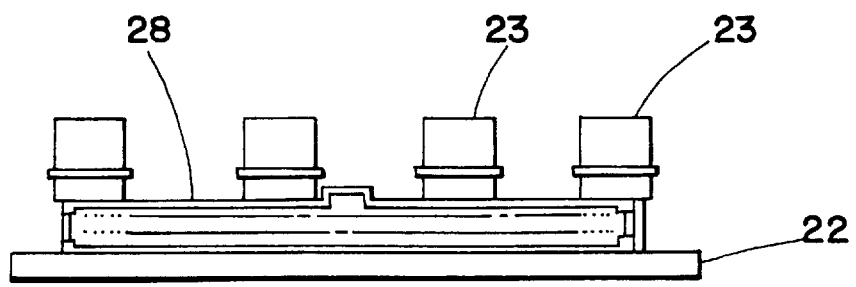
FIG. 4 is a elevational view of a multi-pin connector adapter in accordance with another embodiment of the present invention.

FIGS. 3 and 4 show an alternative embodiment of the present invention. FIG. 3 shows a multi-pin connector adapter 21 comprising circuit board 22 having a number of multi-pin plugs 23 attached to its connect-attachment side surface 24. FIG. 3 also shows wire connector 28 which connects to a ribbon wire via a ribbon wire plug. FIG. 4 is a elevational view of a multi-pin connector adapter in FIG. 3, showing multi-pin plugs 23 and wire connector 28 attached to circuit board 22.

Figure 5:
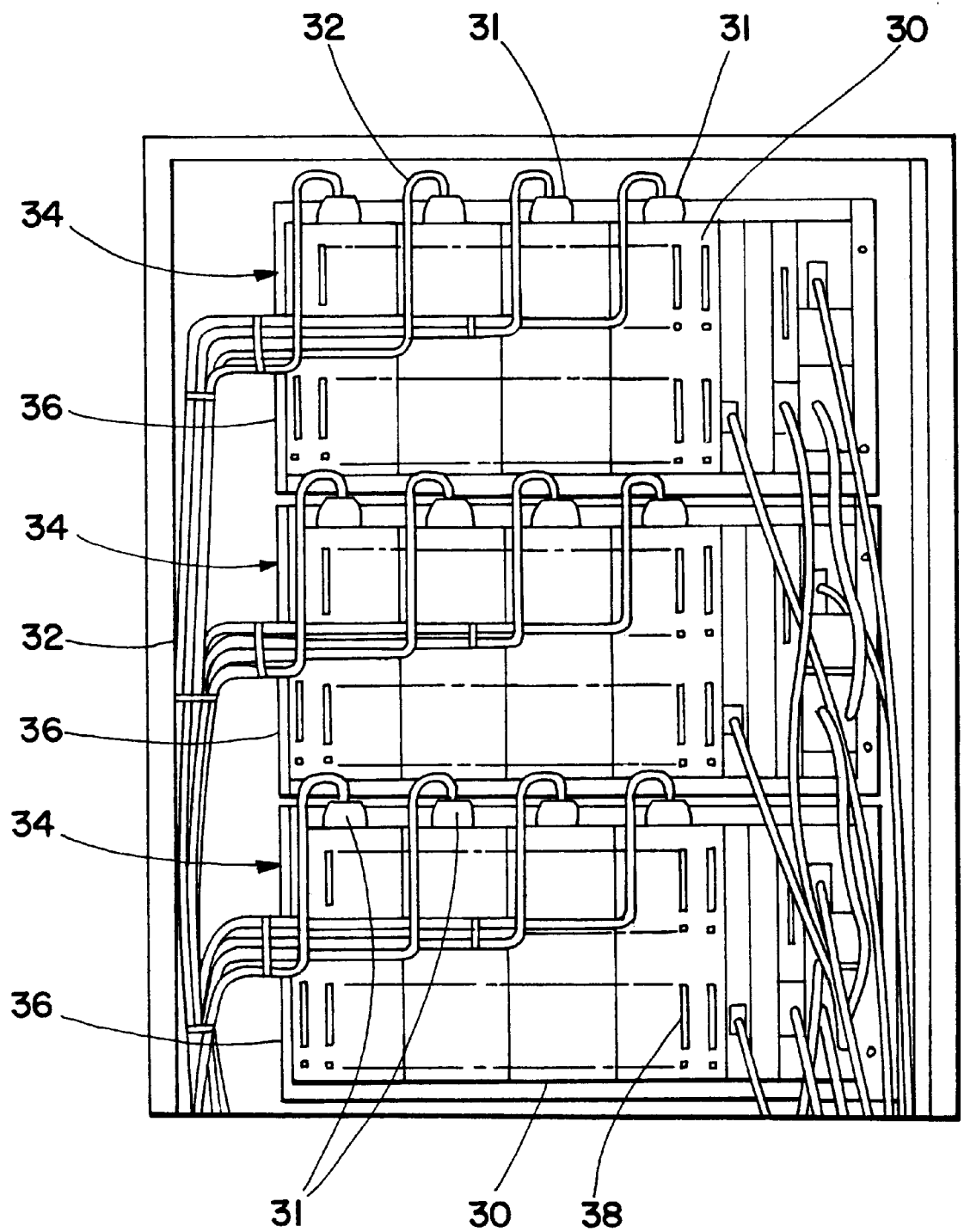
FIG. 5 is an elevational view of the rear side of electrical devices in accordance with one embodiment of the present invention.

FIG. 5 is an elevational view of the rear side of a vertical array of electrical devices 34 that each include an electronic device 36 to which are attached multipin connector adapters in accordance with one embodiment of the present invention. FIG. 5 shows electronic devices 36 each having a number of multipin connectors attached to them. Each multipin connector adapter has a circuit board 30 and a wire connector 31. Each wire connector 31 has a plural electrical wire conduit 32 attached thereto.

Figure 6:
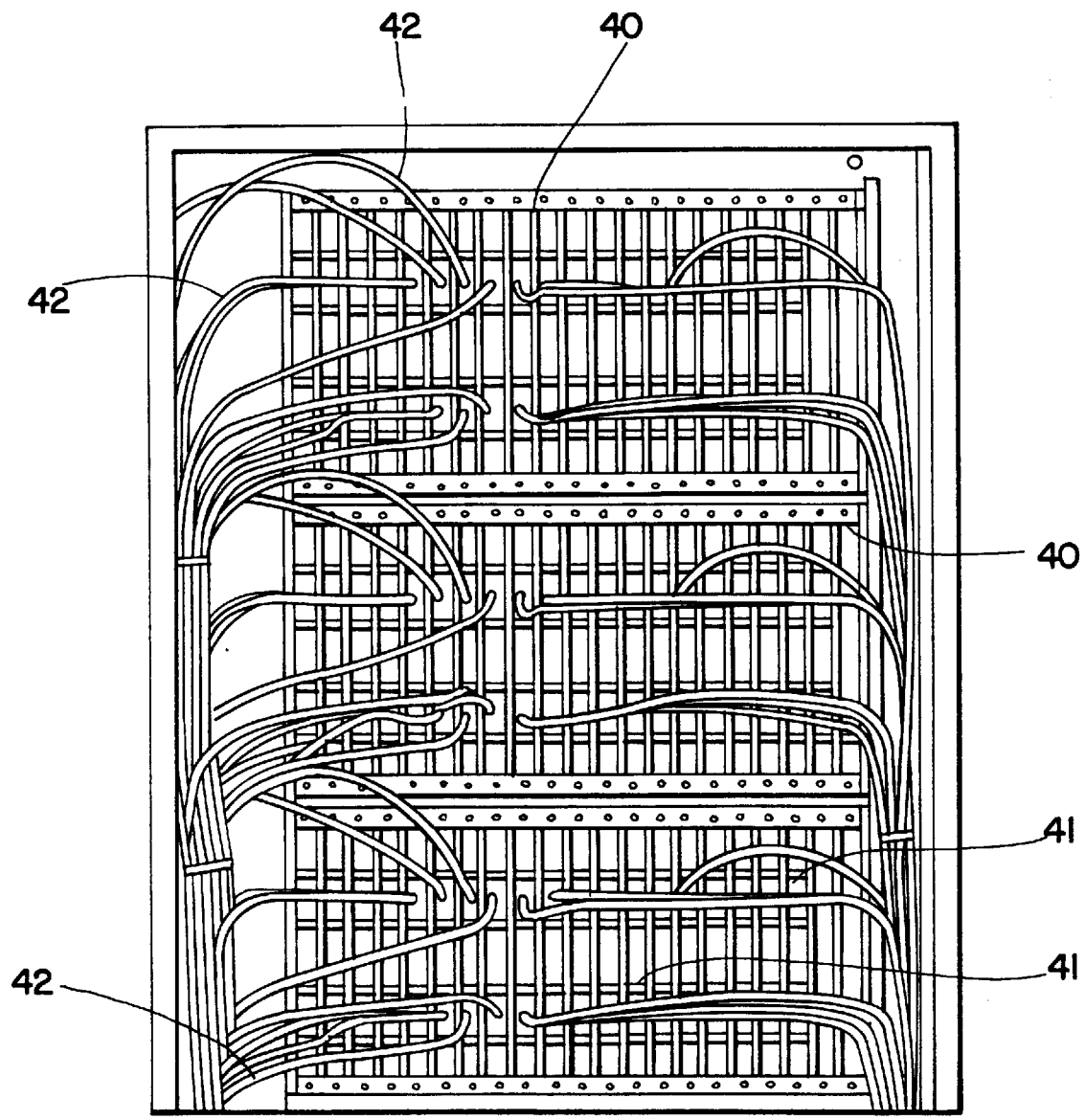
FIG. 6 is an elevational view of the rear side of a vertical array of electronic devices to which are attached several multi-pin wire connectors in accordance with prior art arrangements.

FIG. 6 is an elevational view of the rear side of a vertical array of electronic devices to which are attached several multi-pin wire connectors in accordance with prior art arrangements. This view shows electronic devices 40 each having a number of multi-pin plugs 41 attached to them. Each multi-pin plug 41 has a wire 42 attached thereto. FIG. 6 shows the amount of space occupied by the wires and the difficulty in detaching and reattaching individual multi-pin plugs.

Figure 7:
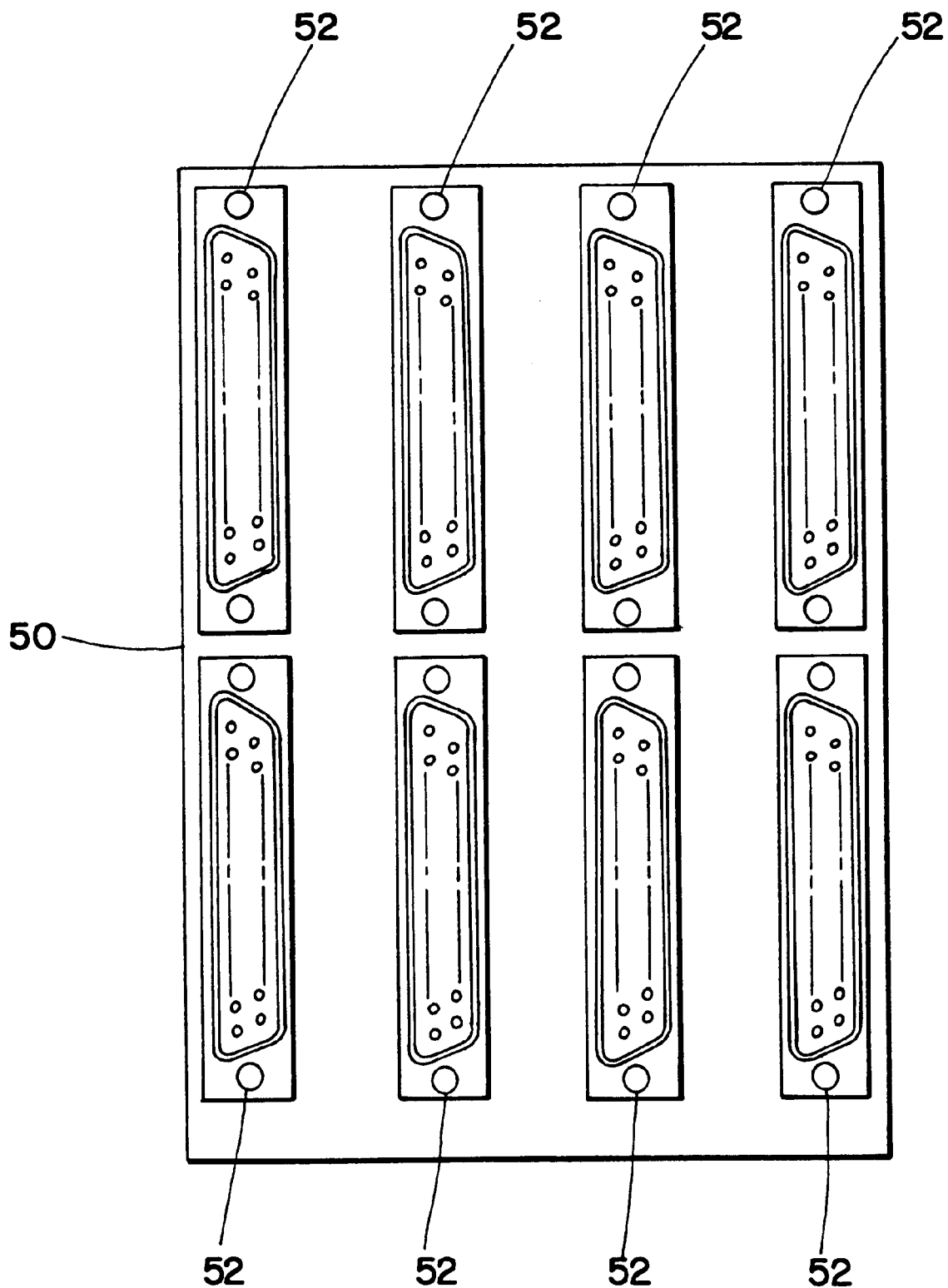
FIG. 7 is a rear elevational view of one embodiment of an electronic device of the present invention that includes a plurality of multipin connectors.

FIG. 7 is a rear elevational view of one embodiment of an electronic device 50 that includes a plurality of multipin connectors 52. As previously discussed, a multipin connector adapter may be placed in electrical communication with the multipin connectors 52.

In light of the foregoing disclosure, it will be within the ability of one skilled in the electrical arts to make modifications to the present invention, such as through the substitution of equivalent parts, arrangements and materials, without departing from the spirit of the invention.

What is claimed is:

1. An adapter for a plurality of multipin connectors, said adapter comprising:
   (a) a circuit board having a connector-mounting side;
   (b) a plurality of first multipin connectors adapted to engage a plurality of second multipin connectors on an electrical device, each of said first multipin connectors disposed on said connector-mounting side of said circuit board so as to be in electrical contact therewith; and
   (c) a plural electrical wire conduit in electrical contact with said circuit board so as to be in electrical contact with each of said first multipin connectors whereby when said first multipin connectors are engaged with said second multipin connectors on said electrical device said plural electrical wire conduit eliminates the need for an electrical wire cable attached to each of said first multipin connectors.

2. An adapter according to claim 1 wherein said first multipin connectors are selected from the group consisting of nine-pin and twenty-five pin connectors.

3. An adapter according to claim 1 wherein said plural electrical wire conduit is ribbon wire.

4. An electrical device comprising:
   (a) an electronic device having a plurality of second multipin connectors; and
   (b) an adapter, said adapter comprising:
      (i) a circuit board having a connector-mounting side;
      (ii) a plurality of first multipin connectors, said first multipin connectors adapted to engage said second multipin connectors, and each of said first multipin connectors disposed on said connector-mounting side of said circuit board so as to be in electrical contact therewith; and
      (iii) a plural electrical wire conduit in electrical contact with said circuit board so as to be in electrical contact with each of said first multipin connectors whereby when said first multipin connectors are engaged with said second multipin connectors on said electronic device said plural electrical wire conduit eliminates the need for an electrical wire cable attached to each of said first multipin connectors.

5. An electrical device according to claim 4 wherein said first and second multipin connectors are selected from the group consisting of nine-pin and twenty-five pin connectors.

6. An electrical device according to claim 4 wherein said plural electrical wire conduit is ribbon wire.

7. An electrical device according to claim 4 wherein said electronic device is selected from the group consisting of modems, amplifiers, receivers, transceivers, and tuners.

8. A method for minimizing the number of electrical wire cables connected to an electrical device having a plurality of second multipin connectors, said method comprising:

providing said electrical device having said plurality of second multipin connectors;

providing an adapter comprising a circuit board, a plurality of first multipin connectors, and a plural electrical wire conduit, said first multipin connectors disposed on a connector-mounting side of said circuit board and in electrical communication with said circuit board, said first multipin connectors adapted to engage said second multipin connectors, said plural electrical wire conduit in electrical communication with said circuit board so as to be in electrical communication with each of said first multipin connectors; and engaging said first multipin connectors to said second multipin connectors;

whereby each of said second multipin connectors is in electrical communication with said plural electrical wire conduit such that the need is eliminated for a separate electrical wire cable attached to each of said first multipin connectors.

9. A method according to claim 8 wherein said first and second multipin connectors are selected from the group consisting of nine-pin and twenty-five pin connectors.

10. A method according to claim 8 wherein said plural electrical wire conduit is ribbon wire.

11. A method according to claim 8 wherein said electrical device is selected from the group consisting of modems, amplifiers, receivers, transceivers, tuners, and computers.

* * * * *